(12) United States Patent
Ahn et al.

(10) Patent No.: US 9,543,313 B2
(45) Date of Patent: Jan. 10, 2017

(54) NONVOLATILE MEMORY DEVICE AND METHOD FOR FABRICATING THE SAME

(71) Applicant: SK hynix Inc., Gyeonggi-do (KR)

(72) Inventors: Young-Soo Ahn, Gyeonggi-do (KR); Jeong-Seob Oh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/680,714

(22) Filed: Apr. 7, 2015

(65) Prior Publication Data

US 2015/0214240 A1 Jul. 30, 2015

Related U.S. Application Data

(62) Division of application No. 13/608,856, filed on Sep. 10, 2012, now Pat. No. 9,024,372.

(30) Foreign Application Priority Data

May 15, 2012 (KR) .................... 10-2012-0051572

(51) Int. Cl.
*H01L 21/3205* (2006.01)
*H01L 21/4763* (2006.01)
*H01L 27/115* (2006.01)
*H01L 29/66* (2006.01)

(52) U.S. Cl.
CPC ... *H01L 27/11556* (2013.01); *H01L 27/11524* (2013.01); *H01L 29/66666* (2013.01); *H01L 29/66825* (2013.01)

(58) Field of Classification Search
CPC ................................. H01L 27/11556
USPC .......................................... 438/588
See application file for complete search history.

(56) References Cited

U.S. PATENT DOCUMENTS

2013/0049095 A1* 2/2013 Whang ............ H01L 27/11556
257/321

* cited by examiner

*Primary Examiner* — Hsin-Yi Hsieh
(74) *Attorney, Agent, or Firm* — IP & T Group LLP

(57) ABSTRACT

A nonvolatile memory device includes: a channel layer protruding perpendicular to a surface of a substrate; a tunnel insulation layer formed on a surface of the channel layer; a stack structure, in which a plurality of floating gate electrodes and a plurality of control gate electrodes are alternately formed along the channel layer; and a charge blocking layer interposed between each floating gate electrode, of the plurality of floating gate electrodes, and each control gate electrode of the plurality of control gate electrodes, wherein the floating gate electrode includes a first floating gate electrode between two control gate electrodes and a second floating gate electrode positioned in the lowermost and uppermost parts of the stack structure and having a smaller width in a direction parallel to the substrate than the first floating gate electrode.

9 Claims, 6 Drawing Sheets

NONVOLATILE MEMORY DEVICE AND METHOD FOR FABRICATING THE SAME

CROSS-REFERENCE TO RELATED APPLICATIONS

This application is a division of U.S. patent application Ser. No. 13/608,856 filed on Sep. 10, 2012, which claims priority of Korean Patent Application No. 10-2012-0051572, filed on May 15, 2012. The disclosure of each of the foregoing application is incorporated herein by reference in its entirety.

BACKGROUND

1. Field

Exemplary embodiments of the present invention relate to a nonvolatile memory device and a method for fabricating the same, and more particularly, to a nonvolatile memory device having a 3D structure in which a plurality of memory cells are stacked vertically from a substrate, and a method for fabricating the same.

2. Description of the Related Art

A nonvolatile memory device is a memory device, which maintains data stored therein although power supply is cut off. Currently, various nonvolatile memory devices, for example, Flash memory and the like are widely used.

Recently, as the improvement in integration degree of nonvolatile memory devices having a 2D structure in which memory cells are formed as a single layer over a semiconductor substrate approaches the limit, a nonvolatile memory device having a 3D structure in which a plurality of memory cells are formed along a channel layer protruding vertically from a semiconductor substrate has been proposed. Specifically, the nonvolatile memory device having a 3D structure may include a structure for storing changes in a floating gate electrode formed of a conductor and a structure for storing charges in a charge trap layer formed of an insulator.

FIGS. 1A and 1B are cross-sectional views of a conventional nonvolatile memory device having a 3D structure.

Referring to FIGS. 1A and 1B, the 3D nonvolatile memory device which stores charges in a floating gate electrode may include a channel layer 70 formed through a plurality of interlayer dielectric layers 20 and a plurality of control gate electrodes 30 which are alternately stacked over a substrate 10, a tunnel insulation layer 60 surrounding the channel layer 70, a floating gate electrode 50 interposed between the interlayer dielectric layers 20 and the tunnel insulation layer 60, and a charge blocking layer 40 surrounding the floating gate electrode 50.

In the nonvolatile memory device of FIG. 1A, the floating gate electrodes 50 positioned in the uppermost and lowermost parts are dummy floating gate electrodes adjacent to only one control gate electrode 30, and thus difficult to control. Accordingly, an abnormal program operation may occur, and a channel current may be reduced during a read operation.

Meanwhile, when a control gate electrode 30 is disposed on the substrate 10 as illustrated in FIG. 1B, a dummy floating gate electrode is not formed in the lowermost part, but the control gate electrode 30 is directly connected to the substrate 10. Therefore, the control gate electrode 30 is shorted to a well pick-up area, and cannot be controlled independently of the well pick-up area. Therefore, there is a demand for the development of a structure capable of solving the above-described problems.

SUMMARY

An embodiment of the present invention is directed to a nonvolatile memory device and a method for fabricating the same, which minimizes the size of a dummy floating gate electrode to reduce a coupling ratio between the dummy floating gate electrode and a control gate electrode, thereby improving an operation characteristic.

In accordance with an embodiment of the present invention, a nonvolatile memory device includes: a channel layer protruding perpendicular to a surface of a substrate; a tunnel insulation layer formed on a surface of the channel layer; a stack structure, in which a plurality of floating gate electrodes and a plurality of control gate electrodes are alternately formed along the channel layer; and a charge blocking layer interposed between each floating gate electrode, of the plurality of floating gate electrodes, and each control gate electrode of the plurality of control gate electrodes, wherein a first portion of the plurality of the floating gate electrodes arranged so that each floating gate electrode, of the first portion of floating gate electrodes, is positioned between two control gate electrodes of the plurality of control gate electrodes, and wherein a floating gate electrode, of the plurality of floating gate electrodes, is positioned at a lowermost and at an uppermost part of the stack structure, and wherein the floating gate electrode, of the plurality of floating gate electrodes, positioned at the lowermost and at the uppermost part of the stack structure each has a smaller width, in a direction parallel to the substrate, than a width of each floating gate electrode of the first portion of the plurality of floating gate electrodes.

In accordance with another embodiment of the present invention, a method for fabricating a nonvolatile memory device includes: forming a first interlayer dielectric layer over a substrate; forming a stack structure in which a plurality of sacrificial layers and a plurality of second interlayer dielectric layers are alternately stacked over the first interlayer dielectric layer; forming a third interlayer dielectric layer over an uppermost sacrificial layer of the plurality of sacrificial layers; forming a hole in the first to third interlayer dielectric layers and the sacrificial layers, the hole exposing the first to third interlayer dielectric layers, the sacrificial layers, and the substrate; etching the first to third interlayer dielectric layers, exposed through the hole, to form a plurality of grooves; and sequentially forming a charge blocking layer and a floating gate electrode in each of the plurality of grooves, wherein the first and third interlayer dielectric layers have a lower etch rate than plurality of the second interlayer dielectric layer.

DETAILED DESCRIPTION

Figure 1A:
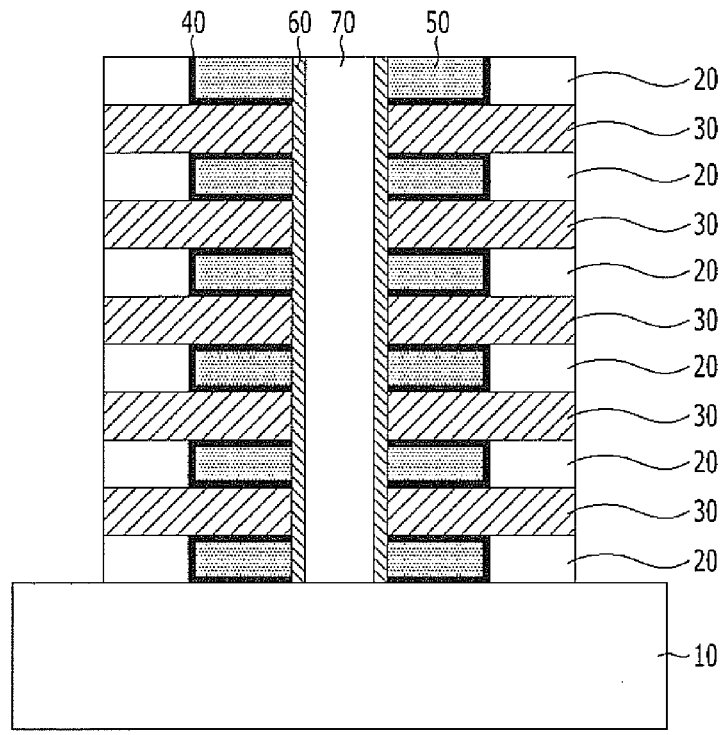
FIGS. 1A and 1B are cross-sectional views of a conventional nonvolatile memory device having a 3D structure.
Figure 1B:
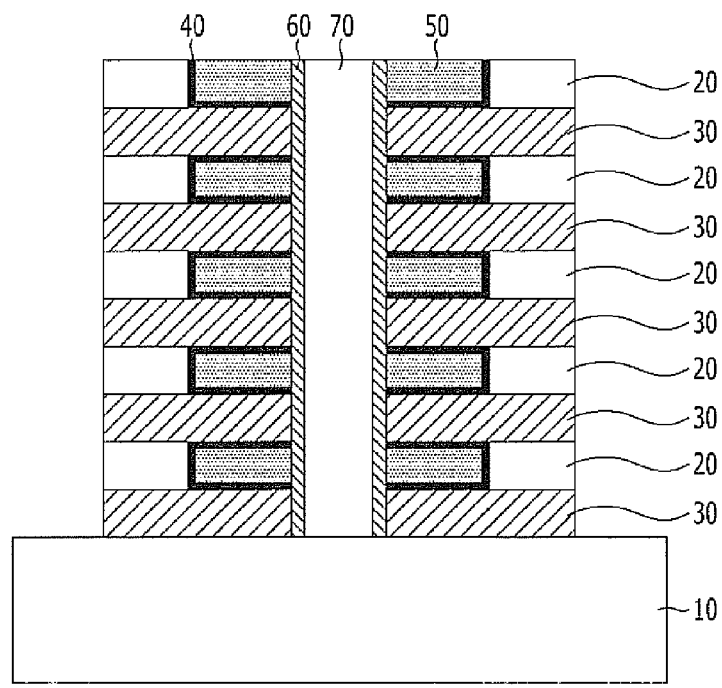

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
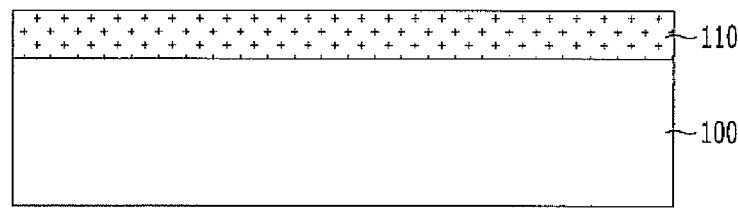
FIGS. 2A to 2J are cross-sectional views for explaining a nonvolatile memory device and a method for fabricating the same in accordance with an embodiment of the present invention.
Figure 2B:
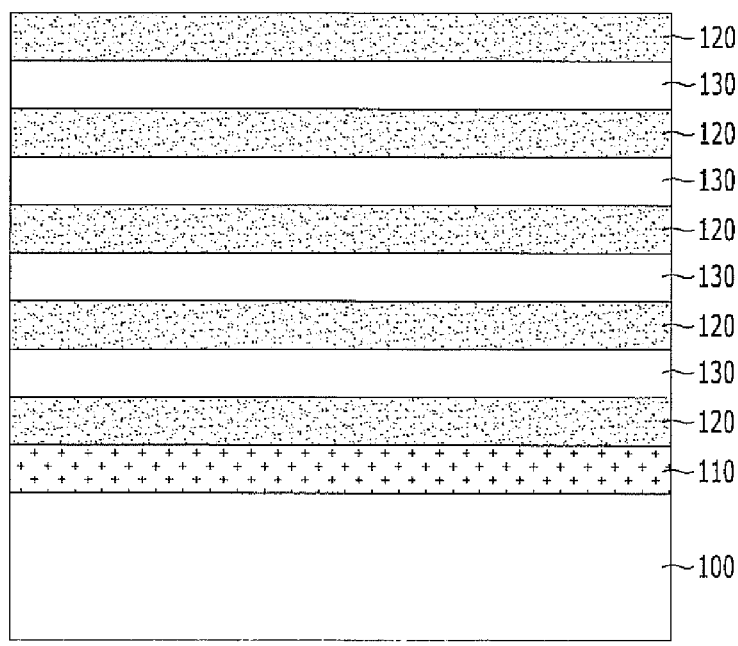
Figure 2C:
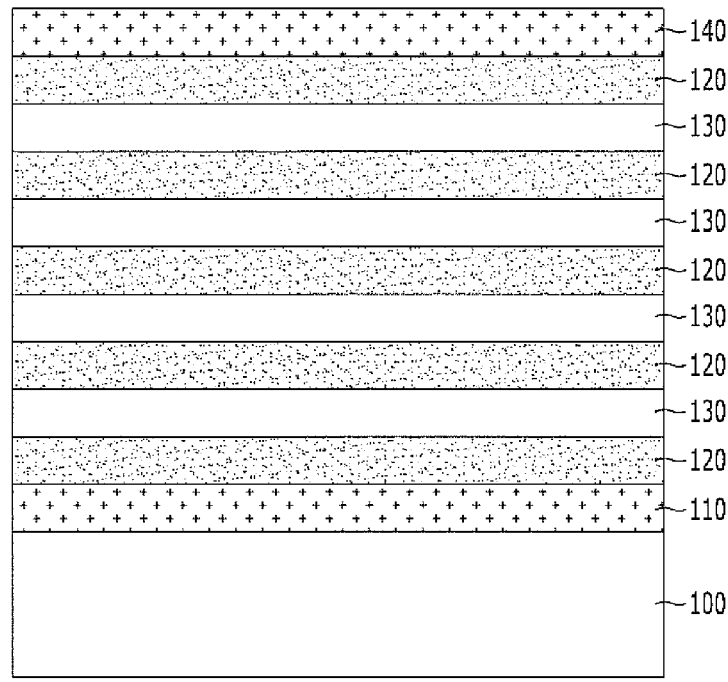
Figure 2D:
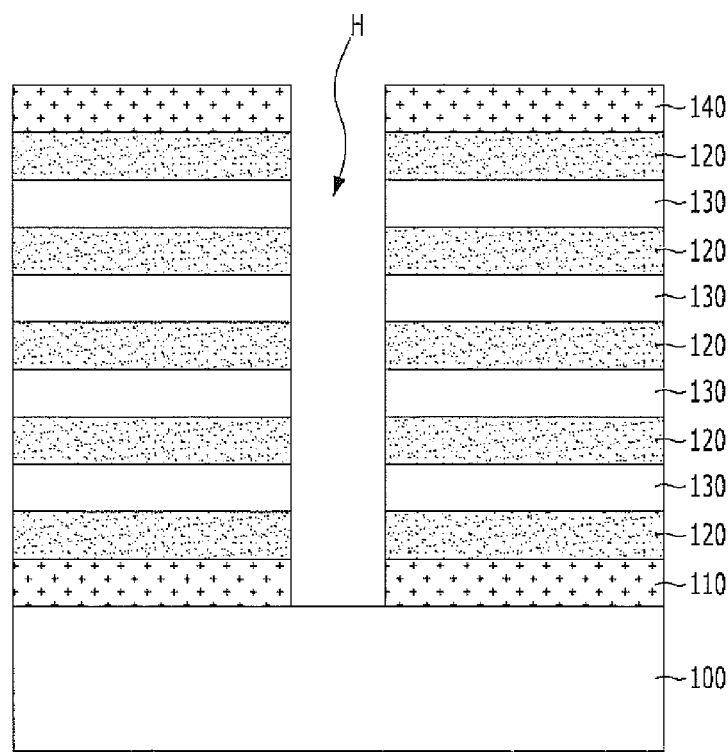
Figure 2E:
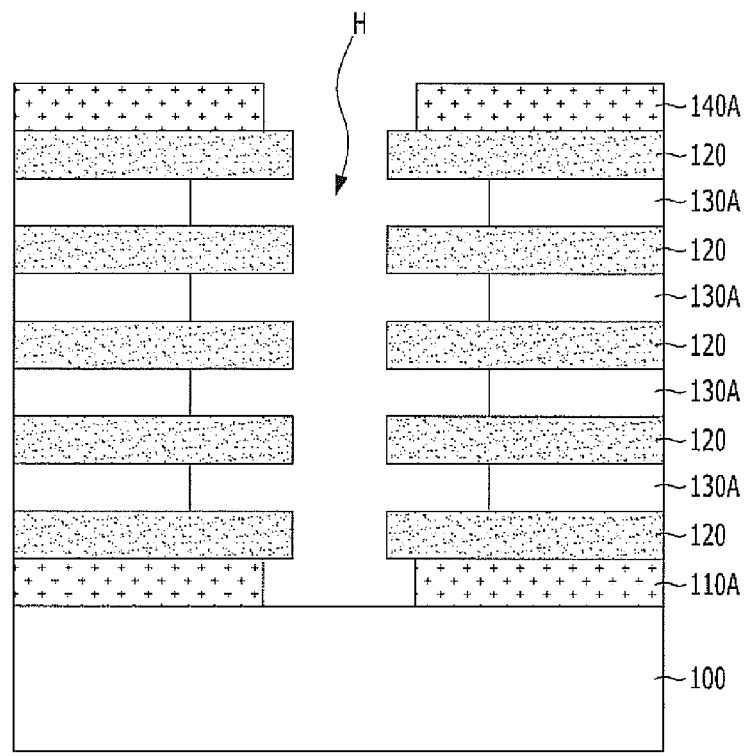
Figure 2F:
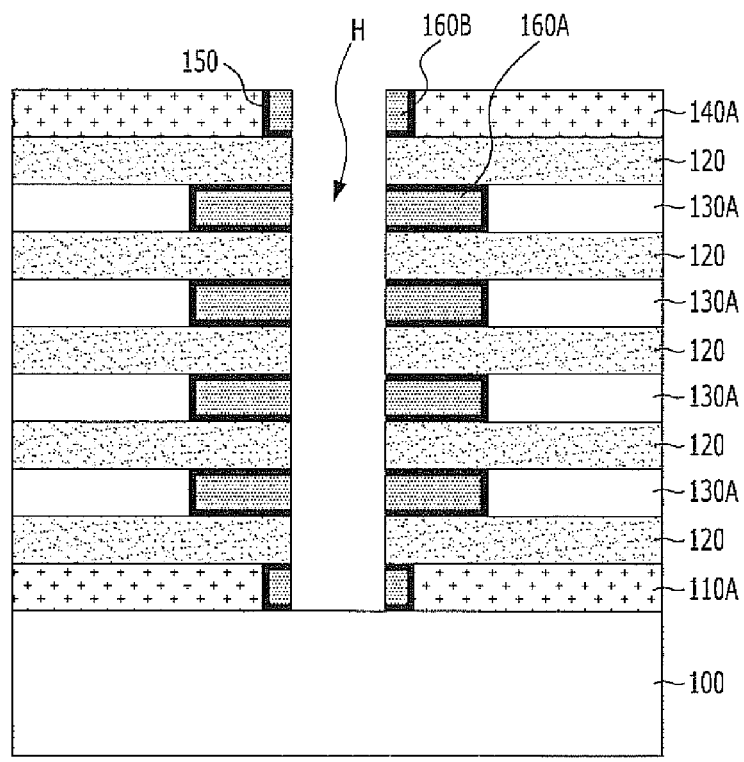
Figure 2G:
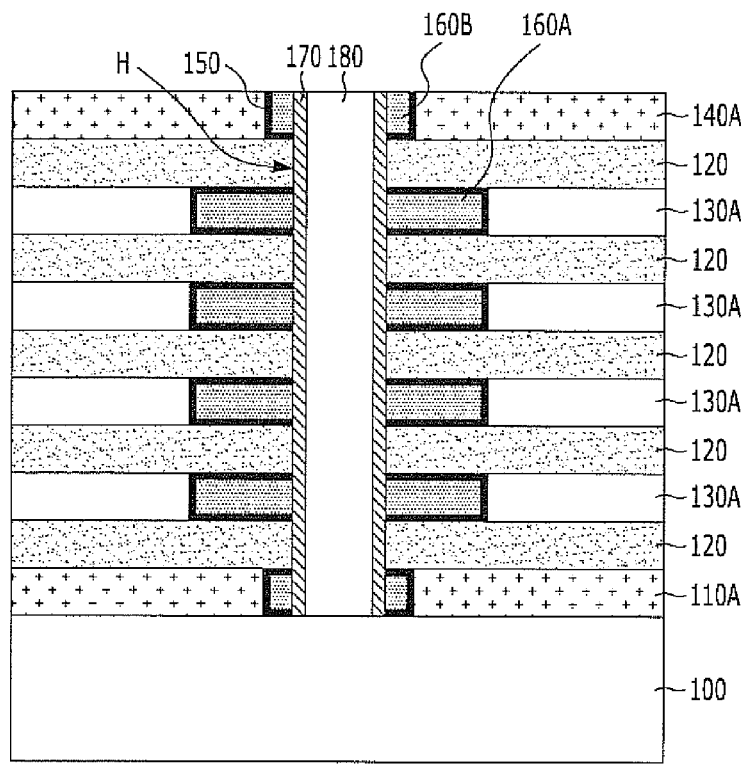
Figure 2H:
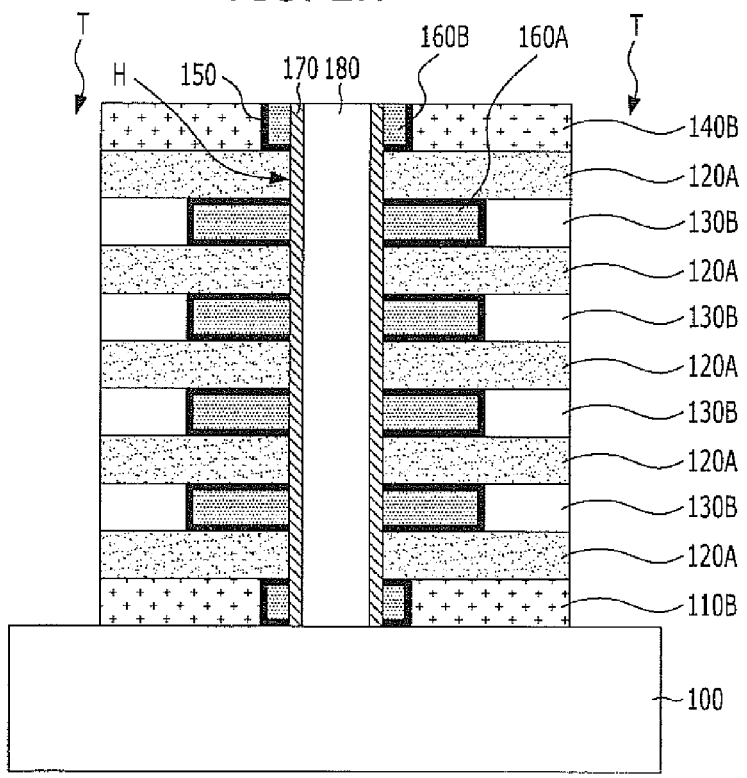
Figure 2I:
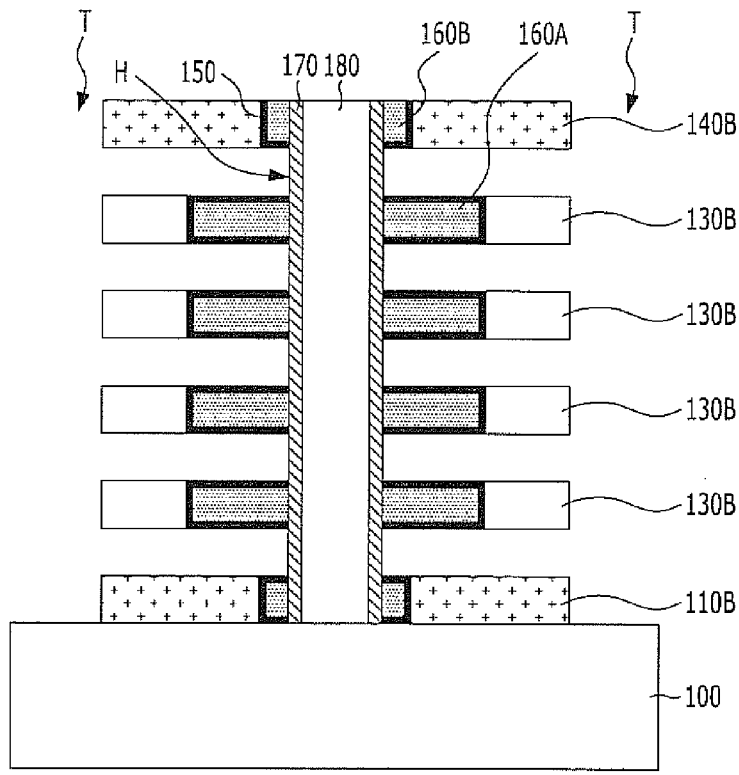
Figure 2J:
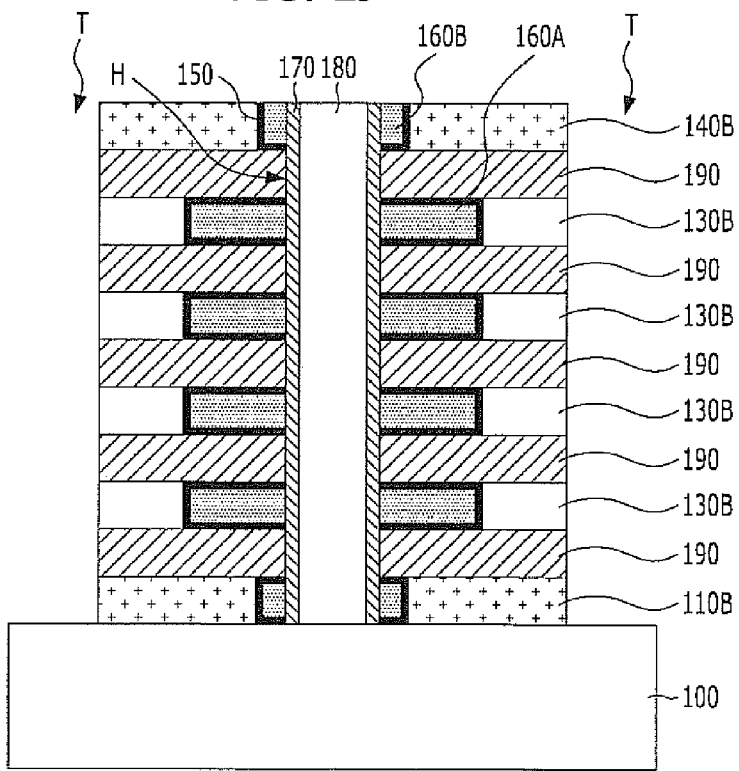

FIGS. 2A to 2J are cross-sectional views for explaining a nonvolatile memory device and a method for fabricating the same in accordance with an embodiment of the present invention. FIG. 2J is a cross-sectional view of the nonvolatile memory device in accordance with the embodiment of the present invention, and FIGS. 2A to 2I are cross-sectional views illustrating examples of intermediate processes for fabricating the nonvolatile memory device of FIG. 2J.

Referring to FIG. 2A, a first interlayer dielectric layer 110 is formed over a substrate 100. The substrate 100 may include a semiconductor substrate formed of single-crystal silicon, and have a predetermined lower structure (not illustrated).

Here, the first interlayer dielectric layer 110 is densely formed to have a lower etch rate than a second interlayer dielectric layer to be described below. For example, the first interlayer dielectric layer 110 may be formed of an oxide-based material. In the case of silicon oxide ($SiO_2$), the density of a thin film may differ depending on a deposition process such as low-pressure chemical vapor deposition (LP-CVD), plasma enhanced CVD (PE-CVD), atomic layer deposition (ALD) or physical vapor deposition (PVD). For example, silicon oxide formed by atmospheric pressure CVD (AP-CVD) has larger resistance to a wet etching solution, such as buffered oxide etchant or hydro-fluoric acid (HF), than tetra ethyl ortho silicate (TEOS) or high temperature oxide (HTO).

Furthermore, although the same deposition method is applied, the etch rate may be reduced through a densification process. For example, after a dielectric layer is formed, annealing or rapid thermal processing (RTP) may be performed to densify the dielectric layer, thereby increasing the resistance to wet etching.

Referring to FIG. 2B, a plurality of sacrificial layers 120 and a plurality of second interlayer dielectric layers 130 are alternately stacked over the first interlayer dielectric layer 110. Hereafter, for convenience of description, the structure in which the plurality of sacrificial layers 120 and the plurality of interlayer dielectric layers 130 are alternately stacked is referred to as a stack structure.

Here, the sacrificial layer 120 may be arranged at the lowermost and uppermost parts of the stack structure, and the second interlayer dielectric layer 130 may be formed of an oxide-based material having a higher etch rate than the first interlayer dielectric layer 110 and a third interlayer dielectric layer to be described below. Furthermore, the sacrificial layer 120 is removed through a subsequent process to provide a space in which a control gate electrode to be described below is to be formed, may be formed of a material having an etching selectivity with the first interlayer dielectric layer 110, the second interlayer dielectric layer 130, and the third interlayer dielectric layer to be described below, for example, a nitride-based material. FIG. 2B illustrates five sacrificial layers 120. However, the number of sacrificial layers 120 is only an example, and may be set to less or more than five.

Referring to FIG. 2C, the third dielectric layer 140 is formed over the sacrificial layer 120 formed at the uppermost part of the stack structure. The third interlayer dielectric layer 140 is densely formed to have a lower etch rate than the second interlayer dielectric layer 130. For example, the third interlayer dielectric layer 140 may be formed of the same oxide-based material as the first interlayer dielectric layer 110.

Here, the third interlayer dielectric layer 140 may be formed by a different deposition method from the second interlayer dielectric layer 130, which may be selected from LP-CVD, PE-CVD, ALD, PVD and the like. Alternatively, although the third interlayer dielectric layer 140 is deposited by the same method, a densification process such as annealing or RTP may be performed to reduce the etch rate.

Referring to FIG. 2D, the third interlayer dielectric layer 140, the stack structure, and the first interlayer dielectric layer 110 are selectively etched to form a hole H opening the substrate 100.

Here, the hole H may have a circular or elliptical shape when seen from the top, and a plurality of holes H may be arranged in a matrix shape. In particular, when oxide and nitride layers are alternately stacked to form the stack structure, the stack structure having a vertical etch profile may be more easily formed than in an existing method in which oxide and polysilicon layers are alternately stacked.

Referring to FIG. 2E, the first to third interlayer dielectric layers 110, 130, and 140 exposed through the hole H are partially etched and recessed from the side surfaces of the sacrificial layers 120.

Here, a wet etching process using an etching selectivity between the first to third interlayer dielectric layers 110, 130, and 140 and the sacrificial layer 120 may be performed to recess the first to third interlayer dielectric layers 110, 130, and 140. At this time, the first and third interlayer dielectric layers 110 and 140 having a low etch rate are etched less than the second interlayer dielectric layer 130. Furthermore, when the first and third interlayer dielectric layers 110 and 140 have a large difference in etch rate from the second interlayer dielectric layer 130, the first and third interlayer dielectric layers 110 and 140 may be hardly etched. As the result of this process, uneven grooves are formed in the sidewalls of the hole H, and the remaining first to third interlayer dielectric layers 110, 130 and 140 are referred to as first to third primary interlayer dielectric layer patterns 110A, 130A, and 140A, respectively.

Referring to FIG. 2F, a charge blocking layer 150 and floating gate electrodes 160A and 160B are sequentially formed in the grooves formed in the sidewalls of the hole H. At this time, the uppermost and lowermost floating gate electrodes formed in the grooves of the first and third primary interlayer dielectric layers 110A and 140A are dummy floating gate electrodes 160B which are formed to have a smaller width in a direction parallel to the substrate 100 than the floating gate electrodes 160A formed in the grooves of the primary second interlayer dielectric layer patterns 130A.

Here, the charge blocking layer 150 serves to block charges stored in the floating gate electrodes 160A and 160B from moving to the outside, and may be formed by conformally depositing an insulation material along inner walls of the grooves formed in the sidewalls of the hole H according to ALD or CVD. Furthermore, the floating gate electrodes 160A and 160B may be formed by the following process: a conductive material such as doped polysilicon is deposited to such a thickness to fill the grooves formed in the sidewalls of the hole H, etched until the side surfaces of the sacrificial layers 120 are exposed, and separated for the respective layers.

Referring to FIG. 2G, a tunnel insulation layer 170 is formed along the sidewalls of the hole H. The tunnel insulation layer 170 is a layer for charge tunneling, and may be formed by depositing an oxide-based material according to ALD or CVD.

Then, a channel layer 180 is formed in the hole H having the tunnel insulation layer 170 formed thereon. The channel layer 180 may be formed by depositing or growing a semiconductor material, for example, polysilicon. In this embodiment of the present invention, the channel layer 180 may be formed to such a thickness as to completely fill the hole H, but the present invention is not limited thereto. In another embodiment, the channel layer 180 may be formed to such a thickness as not to completely fill the hole H.

Referring to FIG. 2H, the first to third primary interlayer dielectric layer patterns 110A, 130A, and 140A and the sacrificial layers 120 in both sides of the hole H are selectively etched to form a trench T exposing side surfaces of the sacrificial layers 120.

Here, a plurality of trenches T may be arranged in a slit shape extended in a direction crossing the cross-sectional direction of FIG. 2H. The remaining first to third primary interlayer dielectric layer patterns 110A, 130A, and 140A and the remaining sacrificial layer 120 are referred to as first to third secondary interlayer dielectric layer patterns 110B, 130B, and 140B and a sacrificial layer pattern 120A, respectively.

Referring to FIG. 2I, the sacrificial layer pattern 120A exposed through the trench T is removed. At this time, a wet etching process based on a dip-out method using an etching selectivity between the sacrificial layer pattern 120A and the first to third secondary interlayer dielectric layer patterns 110B, 130B, and 140B may be performed to remove the sacrificial layer pattern 120A.

Referring to FIG. 2J, a control gate electrode 190 is formed in a space where the sacrificial layer pattern 120A is removed. The control gate electrode 190 may be formed to have a larger width in a direction parallel to the substrate 100 than the floating gate electrodes 160A and 160B.

Here, the control gate electrode 190 may be formed by the following process: a conductive material such as doped polysilicon or metal is deposited to such a thickness as to fill the space where the sacrificial layer pattern 120A is removed, etched until the side surfaces of the first to third secondary interlayer dielectric layers 110B, 130B, and 140B are exposed, and separated for the respective layers. Meanwhile, in order to improve an interfacial characteristic before the control gate electrode 190 is formed, a barrier metal layer may be formed by conformally depositing titanium nitride (TiN) or the like along the inner walls of the spaces where the sacrificial layer patterns 120A are removed.

Through the above-described fabrication method, it is possible to fabricate the nonvolatile memory device in accordance with the embodiment of the present invention.

Referring to FIG. 2J, the nonvolatile memory device in accordance with the embodiment of the present invention may include the channel layer 180 protruding vertically from the substrate 100, the tunnel insulation layer 170 surrounding the side surface of the channel layer 180, the stack structure in which the plurality of floating gate electrodes 160A and 160B and the plurality of control gate electrodes 190 are alternately stacked along the channel layer 180, the charge blocking layer 150 interposed between the floating gate electrodes 160A and 160B and the control gate electrode 190, and the first to third secondary interlayer dielectric layer patterns 110B, 130B, and 140B surrounding the outer surfaces of the floating gate electrodes 160A and 160B.

Here, the floating gate electrodes 160B positioned at the lowermost and uppermost parts of the stack structure are dummy floating gate electrodes, and have a smaller width in a direction parallel to the substrate 100 than the floating gate electrode 160A positioned between two control gate electrodes 190. Furthermore, the control gate electrode 190 may have a larger width in the direction parallel to the substrate 100 than the floating gate electrodes 160A and 160B.

Meanwhile, the nonvolatile memory device in accordance with the embodiment of the present invention may include a plurality of memory cells arranged along the channel layer 180, and each of the memory cells may include the floating gate electrode 160A and the pair of control gate electrodes 190 adjacent to the floating gate electrode 160A.

In the nonvolatile memory device and the method for fabricating the same in accordance with the embodiment of the present invention, it is possible to minimize the size of the dummy floating gate electrode positioned in the uppermost or lowermost part among the plurality of floating gate electrodes formed along the channel protruding vertically from the substrate and adjacent to the control gate electrode and the substrate. Accordingly, an area where the dummy floating gate electrode is contacted with the control gate electrode decreases to reduce a coupling ratio therebetween. Therefore, it is possible to not only prevent an abnormal program operation in the dummy floating gate electrode but also prevent a channel current from decreasing during a read operation.

In accordance with the embodiments of the present invention, the size of the dummy floating gate electrode may be minimized to reduce a coupling ratio between the dummy floating gate electrode and the control gate electrode, which makes it possible to improve an operation characteristic of the nonvolatile memory device.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a nonvolatile memory device, the method comprising:
   forming a first interlayer dielectric layer over a substrate;
   forming a stack structure in which a plurality of sacrificial layers and a plurality of second interlayer dielectric layers are alternately stacked over the first interlayer dielectric layer;
   forming a third interlayer dielectric layer over an uppermost sacrificial layer of the plurality of sacrificial layers;
   forming a hole in the first, second and third interlayer dielectric layers and the sacrificial layers, the hole exposing the first, second and third interlayer dielectric layers, the sacrificial layers, and the substrate;
   etching the first, second and third interlayer dielectric layers, exposed through the hole, to form a plurality of grooves in the first, second and third interlayer dielectric layers; and sequentially forming a charge blocking layer and a floating gate electrode in each of the plurality of grooves, wherein the first and third interlayer dielectric layers have a lower etch rate than the plurality of second interlayer dielectric layer, wherein the first and third interlayer dielectric layers are denser than each of the plurality of second interlayer dielectric layers.

2. The method of claim 1, wherein forming the first or third interlayer dielectric layer comprises:
depositing a dielectric layer; and
densifying the dielectric layer through a heat treatment.

3. The method of claim 1, wherein sequentially forming the charge blocking layer and the floating gate electrode, in each of the plurality of grooves, further comprises:
forming a first floating gate electrode, having a first width, in the grooves formed in the first and third interlayer dielectric layers; and
forming a second floating gate electrode, having a second width that is greater than the first width, in each of the grooves formed in the plurality of second interlayer dielectric layers.

4. The method of claim 1, wherein each of the plurality of sacrificial layers has an etching selectivity with the first, second and third interlayer dielectric layers.

5. The method of claim 1, further comprising sequentially forming a tunnel insulation layer and a channel layer along sidewalls of the hole.

6. The method of claim 5, further comprising:
forming a trench on each side of the hole, the trench extending through the plurality of sacrificial layers to expose the plurality of sacrificial layers and the substrate;
removing the plurality of sacrificial layers, exposed by the trench, to form a plurality of spaces; and
forming a control gate electrode in each of the plurality spaces.

7. The method of claim 6, wherein each of the control gate electrodes has a larger width, in a direction parallel to the substrate, than each of the floating gate electrodes.

8. A method for fabricating a nonvolatile memory device, the method comprising:
forming a first interlayer dielectric layer over a substrate;
forming a stack structure in which a plurality of sacrificial layers and a plurality of second interlayer dielectric layers are alternately stacked over the first interlayer dielectric layer;
forming a third interlayer dielectric layer over an uppermost sacrificial layer of the plurality of sacrificial layers;
forming a hole in the first, second and third interlayer dielectric layers and the sacrificial layers, the hole exposing the first, second and third interlayer dielectric layers, the sacrificial layers, and the substrate;
etching the first, second and third interlayer dielectric layers, exposed through the hole, to form a plurality of grooves in the first, second and third interlayer dielectric layers; and sequentially forming a charge blocking layer and a floating gate electrode in each of the plurality of grooves, wherein the first and third interlayer dielectric layers have a lower etch rate than the plurality of second interlayer dielectric layers, wherein sequentially forming the charge blocking layer and the floating gate electrode, in each of the plurality of grooves, further comprises:
forming a first floating gate electrode, having a first width, in the grooves formed in the first and third interlayer dielectric layers; and
forming a second floating gate electrode, having a second width that is greater than the first width, in each of the grooves formed in the plurality of second interlayer dielectric layers.

9. A method for fabricating a nonvolatile memory device, the method comprising:
forming a first interlayer dielectric layer over a substrate;
forming a stack structure in which a plurality of sacrificial layers and a plurality of second interlayer dielectric layers are alternately stacked over the first interlayer dielectric layer;
forming a third interlayer dielectric layer over an uppermost sacrificial layer of the plurality of sacrificial layers;
forming a hole in the first, second and third interlayer dielectric layers and the sacrificial layers, the hole exposing the first, second and third interlayer dielectric layers, the sacrificial layers, and the substrate;
etching the first, second and third interlayer dielectric layers, exposed through the hole, to form a plurality of grooves in the first, second and third interlayer dielectric layers; and
sequentially forming a plurality of charge blocking layers and a plurality of floating gate electrodes in the plurality of grooves, respectively,
wherein the first and third interlayer dielectric layers have a lower etch rate than the plurality of second interlayer dielectric layers,
wherein a lowermost floating gate electrode of the plurality of floating gate electrodes is positioned at a lowermost part of the stack structure and an uppermost floating gate electrode of the plurality of floating gate electrodes is positioned at an uppermost part of the stack structure, and each of the plurality of floating gate electrodes has a constant thickness, in a direction perpendicular to a surface of the substrate, throughout its left edge to its right edge, and the lowermost and the uppermost floating gate electrodes have a smaller horizontal width in a direction parallel to the surface of the substrate, than a horizontal width of each of the plurality of floating gate electrodes between the lowermost and the uppermost floating gate electrodes.

* * * * *